(12) United States Patent
Funahashi et al.

(10) Patent No.: US 9,826,641 B2
(45) Date of Patent: Nov. 21, 2017

(54) ELECTRONIC DEVICE MOUNTING BOARD AND ELECTRONIC APPARATUS

(71) Applicant: KYOCERA Corporation, Kyoto-shi, Kyoto (JP)

(72) Inventors: Akihiko Funahashi, Kyoto (JP); Masatsugu Iiyama, Kyoto (JP); Kanae Horiuchi, Kyoto (JP); Yousuke Moriyama, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 147 days.

(21) Appl. No.: 14/400,585

(22) PCT Filed: May 31, 2013

(86) PCT No.: PCT/JP2013/065246
§ 371 (c)(1),
(2) Date: Nov. 12, 2014

(87) PCT Pub. No.: WO2013/180288
PCT Pub. Date: Dec. 5, 2013

(65) Prior Publication Data
US 2015/0124422 A1    May 7, 2015

(30) Foreign Application Priority Data
May 31, 2012  (JP) .................................. 2012-124479

(51) Int. Cl.
*H01L 31/0232* (2014.01)
*H05K 1/18* (2006.01)
(Continued)

(52) U.S. Cl.
CPC ............. *H05K 1/181* (2013.01); *H01L 23/04* (2013.01); *H01L 27/14618* (2013.01);
(Continued)

(58) Field of Classification Search
CPC ............... H01L 23/04; H01L 27/14618; H01L 27/14625; H05K 1/0296; H05K 1/181
(Continued)

(56) References Cited

U.S. PATENT DOCUMENTS

| 6,445,254 B1 * | 9/2002 | Shibuya ................... H03B 5/32 257/701 |
| 2009/0141165 A1 * | 6/2009 | Nakamura ........... H04N 5/2252 348/374 |

(Continued)

FOREIGN PATENT DOCUMENTS

| CN | 101569178 A | 10/2009 |
| JP | 2005-051015 A | 2/2005 |

(Continued)

OTHER PUBLICATIONS

International Search Report, PCT/JP2013/065246, dated Jul. 17, 2013, 2 pgs.

(Continued)

Primary Examiner — Steven T Sawyer
(74) Attorney, Agent, or Firm — Volpe and Koenig, P.C.

(57) ABSTRACT

There are provided an electronic device mounting board and an electronic apparatus that can be made lower in profile. An electronic device mounting board includes an insulating substrate having an opening in which an electronic device is disposed so as to lie over the opening as seen in a transparent plan view, and a reinforcement portion disposed on a surface or in an interior of the insulating substrate so as to lie around the opening of the insulating substrate as seen in a transparent plan view.

8 Claims, 9 Drawing Sheets

(51) Int. Cl.
*H01L 23/04* (2006.01)
*H01L 27/146* (2006.01)
*H05K 1/02* (2006.01)
*H01L 33/48* (2010.01)
*H05K 1/03* (2006.01)

(52) U.S. Cl.
CPC .......... *H05K 1/0296* (2013.01); *H01L 33/486* (2013.01); *H01L 2224/16225* (2013.01); *H01L 2224/32225* (2013.01); *H01L 2224/73204* (2013.01); *H05K 1/0306* (2013.01); *H05K 1/183* (2013.01); *H05K 2201/09072* (2013.01); *H05K 2201/09781* (2013.01); *H05K 2201/2009* (2013.01)

(58) Field of Classification Search
USPC .......................................................... 257/432
See application file for complete search history.

(56) References Cited

U.S. PATENT DOCUMENTS

| | | | | |
|---|---|---|---|---|
| 2010/0103296 A1* | 4/2010 | Nakagiri | ........... | H01L 27/14618 348/294 |
| 2011/0194023 A1 | 8/2011 | Tam et al. | | |
| 2012/0104524 A1* | 5/2012 | Takeshita | .......... | H01L 27/14618 257/432 |
| 2013/0128109 A1* | 5/2013 | Ichiki | ................ | H01L 27/14618 348/374 |

FOREIGN PATENT DOCUMENTS

| | | |
|---|---|---|
| JP | 2006-201427 A | 8/2006 |
| JP | 2008-263552 A | 10/2008 |
| JP | 2009-099642 A | 5/2009 |
| JP | 2009-140968 A | 6/2009 |
| JP | 2013-516656 A | 5/2013 |
| WO | 2011/084900 A1 | 7/2011 |
| WO | 2012/002378 A1 | 1/2012 |

OTHER PUBLICATIONS

Japanese Office Action with concise English explanation, Japanese Patent Application No. 2014-518763, dated Jul. 12, 2016, 5 pgs.
Chinese Office Action with English concise explanation, Chinese Patent Application No. 201380024215.0, dated Aug. 1, 2016, 7 pgs.

* cited by examiner

ELECTRONIC DEVICE MOUNTING BOARD AND ELECTRONIC APPARATUS

TECHNICAL FIELD

The present invention relates to an electronic device mounting board on which an electronic device, for example, an image pickup device of CCD (Charge Coupled Device) type or CMOS (Complementary Metal Oxide Semiconductor) type, or a light-emitting device such as LED (Light Emitting Diode) is mounted, as well as to an electronic apparatus.

BACKGROUND ART

There is a heretofore known image taking apparatus applicable to a digital camera, an optical sensor, and so forth, which is constructed by mounting, for example, an image pickup device of CCD type or CMOS type on a base substrate. As such an image taking apparatus, there is known a construction comprising: a base substrate having an opening formed centrally thereof and a recess formed at the lower surface thereof, the opening being located inwardly of the recess as seen in a transparent plan view; and an image pickup device flip-chip mounted on the bottom surface of the recess of the base substrate (refer to Patent Literature 1, for example). In the base substrate, a connection electrode is disposed around a through hole formed at the lower surface thereof, and an external terminal is disposed at the outer periphery thereof. Such an image taking apparatus is designed to convert light (image) inputted to a light-receiving section of the image pickup device through the through hole into an electric signal by means of the image pickup device, and transmit the electric signal to the connection electrode of the base substrate.

CITATION LIST

Patent Literature

Patent Literature 1: Japanese Unexamined Patent Publication JP-A 2006-201427

SUMMARY OF INVENTION

Technical Problem

However, as for image taking apparatuses for use in, for example, portability-oriented electronic equipment such as cellular phones or digital cameras, it is required that the apparatus be made even lower in profile. In this regard, in the conventional image taking apparatus as described above, if the thickness of the insulating base substrate is reduced to render the image taking apparatus lower in profile, due to the small thickness of the insulating base substrate, for example, the opening and nearby areas of the insulating base substrate may become deformed under a stress applied to the insulating base substrate when an image pickup device is mounted thereon, and consequently the opening of the insulating base substrate is subjected to stress concentration, thus occurring cracks in the opening of the insulating base substrate.

The invention has been devised in view of the problem associated with the conventional art as mentioned supra, and accordingly an object of the invention is to provide an electronic device mounting board and an electronic apparatus that can be made lower in profile.

Solution to Problem

According to one aspect of the invention, there is provided an electronic device mounting board, comprising: an insulating substrate having an opening; and a reinforcement portion disposed on a surface or in an interior of the insulating substrate so as to lie around the opening of the insulating substrate as seen in a transparent plan view. An electronic device is disposed so as to lie over the opening as seen in a transparent plan view.

According to another aspect of the invention, there is provided an electronic apparatus, comprising: the electronic device mounting board mentioned above; and an electronic device disposed on the electronic device mounting board.

Advantageous Effects of Invention

The electronic device mounting board according to one aspect of the invention comprises the insulating substrate having an opening and the reinforcement portion disposed on a surface or in an interior of the insulating substrate so as to lie around the opening of the insulating substrate as seen in a transparent plan view. An electronic device is disposed so as to lie over the opening as seen in a transparent plan view. In this construction, even if the thickness of the insulating substrate is reduced, for example, when a stress is applied to the electronic device mounting board during the installation of the electronic device thereon, by virtue of the reinforcement portion, the electronic device mounting board is resistant to deformation, wherefore occurrence of cracks in the insulating substrate can be prevented effectively.

The electronic apparatus according to another aspect of the invention can be made lower in profile by virtue of the incorporation of the electronic device mounting board mentioned above.

DESCRIPTION OF EMBODIMENTS

Hereinafter, several exemplificative embodiments of the invention will be described with reference to drawings.

First Embodiment

An electronic apparatus in accordance with a first embodiment of the invention will be described with reference to FIGS. 1 to 3. In this embodiment, the electronic apparatus comprises an electronic device mounting board 1; and an electronic device 11 disposed on the electronic device mounting board 1.

The electronic device mounting board 1 comprises an insulating substrate 2 having an opening 3; and a reinforcement portion 4 disposed around the opening 3 of the insulating substrate 2 as seen in a transparent plan view.

The electronic device mounting board 1 further comprises, for example, an electronic device connection electrode 5 and a wiring conductor 6.

For example, the insulating substrate 2 has a recess 2a disposed at its bottom surface for the placement of the electronic device 11, and is constructed by vertically stacking two or more substantially quadrangular insulating layers made of electrically insulating ceramics such for example as aluminum oxide sintered body, mullite sintered body, silicon carbide sintered body, aluminum nitride sintered body, silicon nitride sintered body or glass ceramics sintered body, or resin such for example as epoxy resin, polyimide resin, acrylic resin, phenol resin, polyester resin or fluorine resin typified by tetrafluoroethylene resin (plastics).

The insulating substrate 2 is, when it is made of aluminum oxide sintered body for example, produced by admixing suitable organic solvent and solution medium in powder of raw materials such as alumina ($Al_2O_3$), silica ($SiO_2$), calcia (CaO), and magnesia (MgO) to form a slurry, molding the slurry into a sheet-like form by a heretofore known technique such as the doctor blade method or the calender roll method to obtain ceramic green sheets, a performing appropriate punching or laser processing on the ceramic green sheet and laminating the two or more ceramic green sheets on top of each other on an as needed basis, and firing the laminated body at high temperature (about 1500 to 1800° C.). In order to form the recess 2a and the opening 3 of the insulating substrate 2, it is advisable to create through holes for the recess 2a and the opening 3 in a number of ceramic green sheets for forming the insulating substrate 2 by means of punching using a die or punch, laser processing, or otherwise during the aforementioned punching or laser processing. Moreover, in the case of forming the recess 2a in the insulating substrate 2, it is advisable to create a through hole for the recess 2a in each of the ceramic green sheets in a manner such that the through hole is larger than the through hole for the opening 3.

On the other hand, when the insulating substrate 2 is made of resin, it can be produced by means of transfer molding, injection molding, or otherwise with use of a mold capable of attaining a desired shape. Alternatively, the insulating substrate 2 may be made of a resin-impregnated matrix made of glass fiber, such for example as glass epoxy resin. In this case, the insulating substrate 2 can be produced by impregnating a glass fiber-made matrix with a precursor of epoxy resin, and then thermally curing the epoxy resin precursor at a predetermined temperature.

In this insulating substrate 2, the opening 3 is formed at substantially the center thereof as seen in a plan view, and also, the reinforcement portion 4 is formed on the surface or in the interior of the insulating substrate 2 so as to lie around the opening 3 of the insulating substrate 2 as seen in a transparent plan view. Thus, although the electronic device mounting board 1 may become deformed in a manner such that its part for installation near the electronic device connection electrode 5 is pushed in the direction of drilling the opening 3 as seen in a plan view under a stress applied to the electronic device mounting board 1 when the electronic device 11 is mounted thereon, by virtue of the reinforcement portion 4 situated around the opening 3, even if the thickness of the insulating substrate 2 is reduced, the electronic device mounting board 1 is resistant to deformation, wherefore occurrence of cracks in the insulating substrate 2 can be prevented effectively. Given that the region around the opening 3 where the reinforcement portion 4 is disposed is located inwardly of at least the inner sidewall of the recess 2a of the insulating substrate 2, then the insulating substrate 2 can be reinforced at that part thereof which has a smaller thickness. Moreover, it is preferable that the reinforcement portion 4-placement region is located in the inner area of the electronic device mounting board 1, including the midportion between the outer edge of the electronic device mounting board 1 and the opening 3; that is, located toward the opening, as seen in a plan view, because, in this case, it is possible to reinforce the region closer to the opening 3 that is susceptible to stress concentration, and thereby protect the opening 3 from deformation more effectively.

The reinforcement portion 4 is, when the insulating substrate 2 is made of ceramics, composed of a metallic layer obtained by metallization of tungsten (W), molybdenum (Mo), manganese (Mn), silver (Ag), copper (Cu), or the like, or composed of an insulating layer made of aluminum nitride sintered body, silicon nitride sintered body, glass ceramics sintered body, or the like.

The metallic layer-made reinforcement portion 4 is deposited on the surface or in the interior of the insulating substrate 2. The reinforcement portion 4, which is obtained by metallization of tungsten (W), molybdenum (Mo), manganese (Mn), silver (Ag), copper (Cu), or the like, is formed in a predetermined position in each of two or more insulating substrates 2 by printing a metal paste in a predetermined shape onto the insulating substrate 2-forming ceramic green sheet by means of screen printing or otherwise, and firing the paste together with the insulating substrate 2-forming ceramic green sheet. Such a metal paste is prepared by kneading powdery metal such as tungsten, molybdenum, manganese, silver, or copper in admixture with suitable solvent and binder while adjusting the viscosity to the desired level. In the interest of enhancement in the strength of adhesion with the insulating substrate 2, the metal paste may contain glass or ceramics.

The insulating layer-made reinforcement portion 4 is formed on the surface of the insulating substrate 2. For example, the reinforcement portion 4 is formed by forming a ceramic green sheet used for the reinforcement portion 4, using aluminum oxide sintered body, mullite sintered body, silicon carbide sintered body, aluminum nitride sintered body, silicon nitride sintered body, or glass ceramics sintered body, in a manner similar to the manner for forming the insulating substrate 2-forming ceramic green sheet, performing punching on the resultant ceramic green sheet, disposing it around the opening 3, and firing a stack of the ceramic green sheet and the insulating substrate 2-forming ceramic green sheet. Alternatively, the reinforcement portion 4 may be formed by printing the insulating substrate 2-forming ceramic paste onto a region around the opening 3, and firing the paste. It is preferable that the reinforcement portion 4 is composed of an insulating layer as thus far described, because, in this case, for example, even if the reinforcement portion 4 is brought into contact with the electronic device connection electrode 5 or the wiring conductor 6 formed on the insulating substrate 2, electrical short circuiting or the like problem will not take place.

Moreover, when the insulating substrate 2 is made of resin, the reinforcement portion 4 is made of a metal material such as copper, gold, aluminum, nickel, chromium, molybdenum, titanium, or an alloy of those metals, or composed of an insulating layer made of resin such as epoxy resin, polyimide resin, acrylic resin, phenol resin, polyester resin, or fluorine resin typified by tetrafluoroethylene resin (plastics).

The metallic layer-made reinforcement portion 4 is deposited on the surface or in the interior of the insulating substrate 2. The reinforcement portion 4 is made of a metal material such as gold (Au), aluminum (Al), nickel (Ni), chromium (Cr), molybdenum (Mo), titanium (Ti), or an alloy of those metals. For example, the reinforcement portion 4 is formed by transfer-printing copper foil processed into a wiring conductor form onto a resin sheet made of glass epoxy resin, and laminating the resin sheets with the transfer-printed copper foil by an adhesive. Alternatively, the reinforcement portion 4 may be obtained by forming metal foil or a metal column integrally with the resin-made insulating substrate, or obtained by depositing metal foil or a metal column on the insulating substrate 2 by means of sputtering, vapor deposition, plating, or otherwise.

The insulating layer-made reinforcement portion 4 is formed on the surface of the insulating substrate 2. For example, the reinforcement portion 4 is made of resin such as epoxy resin, polyimide resin, acrylic resin, phenol resin, polyester resin, or fluorine resin typified by tetrafluoroethylene resin (plastics), and can be formed in a manner similar to the manner for forming the insulating substrate 2.

The reinforcement portion 4 may be of different types, namely a type which is composed of a metallic layer, a type which is composed of an insulating layer, and a type which is obtained by covering an exposed metallic layer with an insulating layer.

Figure 2:
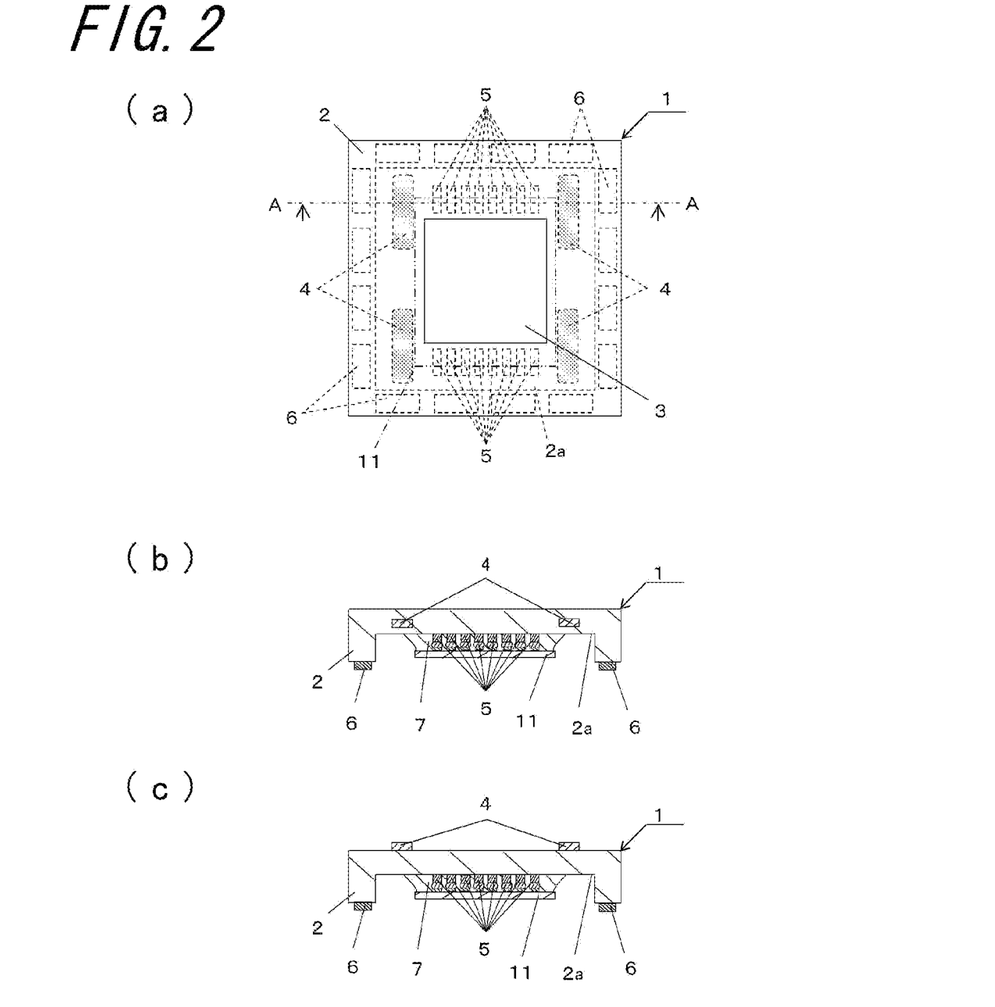
FIG. 2(a) is a transparent plan view showing a modified example of the electronic apparatus in accordance with the first embodiment of the invention.
FIGS. 2(b) and 2(c) are vertical sectional views of the electronic apparatus shown in FIG. 2(a) taken along the line A-A.

The reinforcement portion 4 of the type which is composed of a metallic layer is formed either in the interior of the insulating substrate 2 as shown in FIG. 2(*b*) for example, or on the surface of the insulating substrate 2 as shown in FIGS. 2(*c*), 3(*b*), 4(*b*), 4(*c*), and 5(*b*).

The reinforcement portion 4 of the type which is composed of an insulating layer is formed on the surface of the insulating substrate 2 as shown in FIGS. 2(*c*), 3(*b*), 4(*b*), 4(*c*), and 5(*b*), for example.

Figure 1:
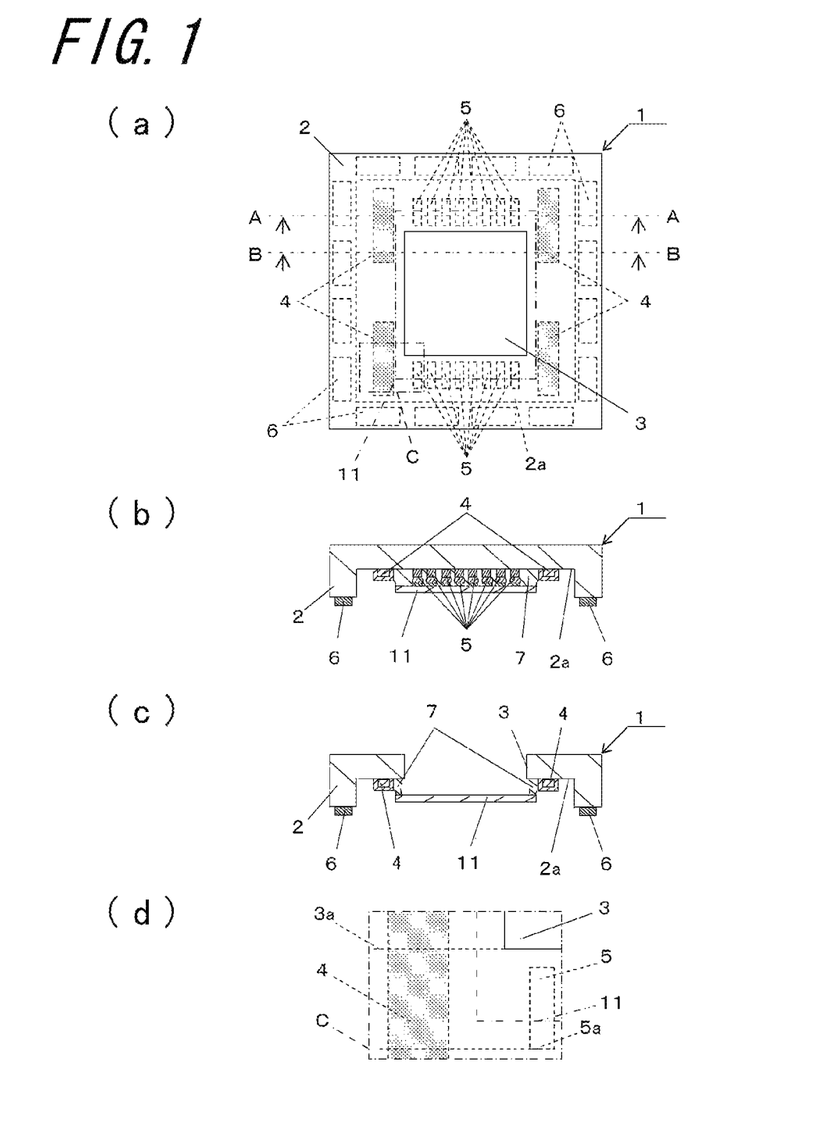
FIG. 1(a) is a transparent plan view showing an electronic apparatus in accordance with a first embodiment of the invention.
FIG. 1(b) is a vertical sectional view of the electronic apparatus shown in FIG. 1(a) taken along the line A-A.
FIG. 1(c) is a vertical sectional view of the electronic apparatus shown in FIG. 1(a) taken along the line B-B.
FIG. 1(d) is an enlarged view of a part C of the electronic apparatus shown in FIG. 1(a)

The reinforcement portion 4 of the type which is obtained by covering an exposed metallic layer with an insulating layer is formed on the surface of the insulating substrate 2 as shown in FIG. 1(*b*), for example.

In the case of providing a reinforcement portion 4 including a metallic layer, such as the reinforcement portion 4 composed of a metallic layer or the reinforcement portion 4 composed of an exposed metallic layer covered with an insulating layer, even if a stress is applied to the insulating substrate 2 when the electronic device 11 is mounted on the insulating substrate 2, since the reinforcement portion 4 including a metallic layer having high strength serves as a strengthening frame, it is possible to render the insulating substrate 2 more resistant to deformation, etc., and thereby cracks are less prone to occur at the opening 3, in particular, around the corner of the opening 3.

Moreover, the reinforcement portion 4 composed of a metallic layer may establish electrical conduction with another wiring line of the insulating substrate 2. The reinforcement portion 4 in conductive relation with another wiring line can be used as a wiring line to effect electrolytic plating for a vicinal alignment mark, for example. On the other hand, when the reinforcement portion 4 establishes no electrical conduction with another wiring line, for example, as shown in FIG. 1, by covering the surface of the metallic layer formed on the surface of the insulating substrate 2 with the above-described insulating layer, it is possible to prevent the reinforcement portion 4 from electrically short-circuiting with a vicinal conductor.

Moreover, at least one reinforcement portion 4 is formed in a single electronic device mounting board 1, and, the reinforcement portion 4 preferably has the shape of a rounded rectangle as seen in a plan view as shown in FIG. 2(*a*) for example, because this shape reduces, for example, the likelihood of corner-originated accidental separation of the reinforcement portion 4, or it may alternatively have the shape of a cross or oval. In addition, reinforcement portions 4 of different shapes may be provided in a single electronic device mounting board 1.

In the example shown in FIG. 1, the reinforcement portion 4 is disposed on one and the same surface as a surface on which the electronic device 11 is mounted, and is composed of a metallic layer and an insulating layer covering the surface of the metallic layer. Since the reinforcement portion 4 is disposed on one and the same surface as the surface on which the electronic device 11 is mounted, when underfilling is effected for sealing using a bonding material 7 such as resin after the installation of the electronic device 11, the reinforcement portion 4 serves as a dam to restrain the bonding material 7 from flowing toward the outer periphery of the electronic device mounting board 1, wherefore the bonding material 7 can be made uniform in amount with ease. Moreover, since the surface of the metallic layer is covered with the insulating layer, even when the reinforcement portion 4 and the electronic device connection electrode 5 on which the electronic device 11 is mounted are located close to each other, it is possible to effectively prevent that the electrode of the electronic device 11 is brought into contact with the electrically conductive reinforcement portion 4 due to misalignment of the electronic device 11 during mounting with consequent occurrence of electrical short circuiting or the like problem. Also, it is possible to prevent the reinforcement portion 4 from oxidation and corrosion, and thereby improve the durability of the reinforcement portion 4. In addition, since the reinforcement portion 4 is disposed on one and the same surface as the surface on which the electronic device 11 is mounted, it follows that reinforcement against deformation of the insulating substrate 2 around the opening 3 is achieved by one and the same surface as a surface to which a stress is applied when the electronic device 11 is mounted, wherefore it is possible to suppress deformation of part of the insulating substrate 2 located toward the opening 3, and thus to further decrease the possibility of occurrence of cracks.

In the example shown in FIG. 2(*b*), the reinforcement portion 4 is formed in the interior of the insulating substrate 2. In the example shown in FIG. 2(*c*), the reinforcement portion 4 is formed on the upper surface of the insulating substrate 2 opposite to the electronic-device 11 mounting surface. By disposing the reinforcement portion 4 in the interior or on the upper surface of the insulating substrate 2, in a case where the electronic device 11 is increased in size, as compared with the example in which the reinforcement portion 4 is disposed on one and the same surface as the surface on which the electronic device 11 is mounted, it is possible to make the electronic apparatus more compact.

The reinforcement portion 4 is disposed around the opening 3 provided in the insulating substrate 2 as seen in a transparent plan view. At this time, in order to enhance the effect of strengthening the insulating substrate 2, it is preferable that the inner end of the reinforcement portion 4 is located inwardly of a position spaced away from the opening 3 toward the outer side of the electronic device mounting board 1 or the wall of the recess 2*a* by a distance equal to 40% of the opening-to-outer side (or wall) distance, and that the width of the reinforcement portion 4 is greater than or equal to 10% of that distance. For example, given that the distance between the opening 3 and the recess 2*a* is 1.53 mm, then it is preferable that the inner end of the reinforcement portion 4 is located inwardly of a position spaced a distance of 0.612 mm away from the opening 3 toward the recess 2*a*. Moreover, the width of the reinforcement portion 4 is greater than or equal to 0.153 mm. By positioning the reinforcement portion 4 in this way, for example, when the electronic device 11 is flip-chip mounted on the electronic device connection electrode 5 by means of a gold bump or the like, it is possible to achieve stress relaxation in a location to which a stress is applied during the installation of the electronic device 11, namely a location closer to the electronic device connection electrode 5 as seen in a plan view, as well as to increase the width of the reinforcement portion 4 for greater stress relaxation effect, and thereby prevent cracks which may occur in the insulating substrate 2 more reliably.

Moreover, in the above-described construction, since the reinforcement portion 4 is disposed along the opening 3 as seen in a transparent plan view, when a stress is applied to the electronic device mounting board 1 during the installation of the electronic device 11 thereon, it is possible to achieve stress relaxation by virtue of the placement of the reinforcement portion 4 along the opening 3 in which cracks are easy to occur, and thereby prevent occurrence of cracks in the insulating substrate 2 more effectively.

Moreover, in the above-described construction, since the opening 3 has a polygonal shape and the reinforcement portion 4 is disposed so as to extend along one side of the polygon as seen in a transparent plan view, the electronic device mounting board 1 may become deformed in such a manner that its part for installation near the electronic device connection electrode 5 is pushed in the direction of drilling the opening 3 as seen in a plan view under a stress applied to the electronic device mounting board 1 when the electronic device 11 is mounted thereon. However, since the direction in which the electronic device mounting board 1 undergoes deformation and the direction of placement of the reinforcement portion 4 are perpendicular to each other, it is possible to enhance the stress relaxation effect, and thereby prevent cracks which may occur in the insulating substrate 2 more reliably.

Moreover, in the above-described construction, since the opening 3 has a polygonal shape and the reinforcement portion 4 is disposed so as to extend along two adjacent sides of the polygon as seen in a transparent plan view, it follows that the reinforcement portion 4 is located around one corner of the opening 3 so as to surround the corner in two directions, and it is thus possible to strengthen the electronic device mounting board 1 in two directions against a stress applied thereto during the installation of the electronic device 11, and thereby prevent cracks which may occur in the insulating substrate 2 more reliably.

Furthermore, as in the example shown in FIG. 1(*d*), when the opening 3 has a polygonal shape such as a rectangular shape and the electronic device connection electrode 5 is provided, it is preferable that the reinforcement portion 4 is disposed so as to straddle a line of extension 3*a* of a side of the opening 3 extending along the electronic device connection electrode 5 as seen in a plan view. By disposing the reinforcement portion 4 so as to straddle the extension line 3*a*, for example, when the electronic device 11 is flip-chip mounted on the electronic device connection electrode 5 by means of a gold bump or the like, it is possible to strengthen the corner of the opening 3 and nearby areas that are most susceptible to concentration of applied stress, and thereby lessen the stress applied to the corner of the opening 3 and nearby areas.

In addition, when the opening 3 has a polygonal shape such as a rectangular shape and the electronic device connection electrode 5 is provided, it is preferable that the outer end of the reinforcement portion 4 is located outwardly of an outer end 5*a* of the electronic device connection electrode 5. By disposing the reinforcement portion 4 so that its outer end is located outwardly of the outer end 5*a* of the electronic device connection electrode 5, it is possible to strengthen, in addition to the corner of the opening 3 and nearby areas as described above, the electronic device connection electrode 5 and nearby areas that are subjected to a stress during the installation of the electronic device 11, and thereby achieve reinforcement in a wider range against the stress applied to the corner of the opening 3 and nearby areas, and also, in this case, even if misalignment takes place when the electronic device 11 is mounted on the electronic device mounting board 1, the stress applied to the opening 3 can be lessened effectively.

In the insulating substrate 2, for example, the electronic device connection electrode 5 is deposited on the bottom surface of the recess 2*a* of the insulating substrate 2, and, the wiring conductor 6 including a through conductor such as a via-hole conductor or a through-hole conductor is deposited so as to extend from the bottom surface of the recess 2*a* of the insulating substrate 2 to the interior of the insulating substrate 2, and from there to the lower surface thereof. Thus, the electronic device connection electrode 5 is electrically connected to an external circuit board (not represented graphically) through the wiring conductor 6. The electronic device connection electrode 5 and the wiring conductor 6 are, when the insulating substrate 2 is made of ceramics, obtained by metallization of tungsten (W), molybdenum (Mo), manganese (Mn), silver (Ag), copper (Cu), or the like, and are each formed in a predetermined position in the insulating substrate 2 by printing a metal paste prepared for the electronic device connection electrode and the wiring conductor 6, in a predetermined shape, onto the insulating substrate 2-forming ceramic green sheet by means of screen printing or otherwise, and firing the paste simultaneously with the ceramic green sheet. Out of internal conductors, a through conductor passing through the ceramic green sheet in the direction of the thickness thereof is advisably formed by filling a through hole formed in the ceramic green sheet with a metal paste by printing. Such a metal paste is prepared by kneading powdery metal such as tungsten (W), molybdenum (Mo), manganese (Mn), silver (Ag), or copper (Cu) in admixture with suitable solvent and binder while adjusting the viscosity to the desired level. In the interest of enhancement in the strength of adhesion with the insulating substrate 2, the metal paste may contain glass or ceramics.

Moreover, the electronic device connection electrode 5 and the wiring conductor 6 are, when the insulating substrate 2 is made of resin, made of a metal material such as copper, gold, aluminum, nickel, chromium, molybdenum, titanium, or an alloy of those metals. For example, the electronic device connection electrode 5 and the wiring conductor 6 are formed by transfer-printing copper foil processed into a wiring conductor form onto a resin sheet made of glass epoxy resin, and laminating the resin sheets with the transfer-printed copper foil by an adhesive. Out of internal conductors, a through conductor passing through the resin sheet in the direction of its thickness is formed by depositing a metal paste on the inner surface of a through hole formed in the resin sheet by means of printing or plating, or formed by filling the through hole with the paste. Alternatively, the through conductor may be obtained by forming metal foil or a metal column integrally with the resin-made insulating substrate, or obtained by depositing metal foil or a metal column on the insulating substrate 2 by means of sputtering, vapor deposition, plating, or otherwise.

Two or more electronic device connection electrodes 5 are formed on the bottom surface of the recess 2*a* of the insulating substrate 2 so as to be electrically connected to their respective electrodes of the electronic device 11 by means of a gold bump or the like.

The electronic device 11 is disposed in the recess 2*a* so as to lie over the opening 3 as seen in a transparent plan view. Moreover, the electronic device 11 has two or more electrodes. The electrodes of the electronic device 11 are electrically connected to their respective electronic device connection electrodes 5 formed on the bottom surface of the recess 2*a* of the insulating substrate 2 by means of a gold bump or the like. That is, the electronic device 11 is flip-chip mounted on the electronic device connection electrodes 5.

The electronic device mounting board 1 of the present embodiment comprises: the insulating substrate 2 having the opening 3, on the insulating substrate 2 the electronic device 11 being disposed so as to lie over the opening 3 as seen in a transparent plan view; and the reinforcement portion 4 disposed on the surface or in the interior of the insulating substrate 2 so as to lie around the opening 3 of the insulating substrate 2 as seen in a transparent plan view.

Next, a method for manufacturing the electronic device mounting board 1 of the present embodiment will be described.

In an insulating substrate 2 made of, for example, aluminum oxide ($Al_2O_3$) sintered body, a recess 2*a* is formed at the bottom surface thereof, for example, for the placement of an electronic device 11, and, an opening 3 is formed within the recess 2*a* as seen in a transparent plan view. In a case where the insulating substrate 2 is made of aluminum oxide sintered body composed predominantly of aluminum oxide ($Al_2O_3$), to powder of $Al_2O_3$, powder of silica ($SiO_2$), magnesia (MgO), or calcia (CaO) is added as sintering aids, and further suitable binder, solvent, and plasticizer are added, and then the resultant mixture is kneaded to prepare a slurry. After that, the slurry is molded into a ceramic green sheet for forming a segmentable board by a heretofore known molding technique such as the doctor blade method.

With use of this ceramic green sheet, the electronic device mounting board 1 is produced by following process steps (1) through (5) as set forth hereunder.

(1) Punching step of performing punching on parts constituting the side wall of the recess 2*a* and the opening of the insulating substrate 2 using a die.

(2) Metal paste print-coating step of forming a reinforcement portion 4 which is formed in a part constituting the region around the opening 3 of the insulating substrate 2 as seen in a plan view; an electronic device connection electrode 5 which is formed in a part constituting the bottom surface of the recess 2*a* of the insulating substrate 2; and a wiring conductor 6 including a through conductor such as a via-hole conductor or a through-hole conductor extending from the bottom surface of the recess 2*a* of the insulating substrate 2 to the interior of the insulating substrate 2, and from there to the lower surface thereof.

(3) Step of producing a ceramic green sheet stacked body by laminating ceramic green sheets constituting respective insulating layers.

(4) Step of obtaining a segmentable board formed with arrangement of two or more insulating substrates 2 each having the opening 3 and the reinforcement portion 4 by firing the ceramic green sheet stacked body.

(5) Step of dividing the fired segmentable board into segments by breaking the board along dividing grooves that are each formed in advance along a part constituting the outer edge of the electronic device mounting board 1, or by cutting the board along the part constituting the outer edge of the electronic device mounting board 1 by means of slicing or otherwise can be used. The dividing groove can be formed by creating an incision which is smaller than the thickness of the segmentable board by slicing equipment after firing, or alternatively it may be formed by pressing a cutter blade onto a molded product of the segmentable board or by creating an incision which is smaller than the thickness of the molded product by slicing equipment.

It is noted that, instead of the print-coated metal paste, the reinforcement portion 4 formed in the ceramic green sheet may be formed, in the laminating step (3), by laminating ceramic green sheets in the form of the reinforcement portion 4 in a location constituting the region around the opening 3. Moreover, an insulating layer made of a ceramic slurry may be applied onto the surface of the metal paste used for the reinforcement portion 4 formed in the metal paste print-coating step (2).

Moreover, the reinforcement portion 4 may be formed on the electronic device mounting board 1 by providing an insulating layer made of resin or the like on the electronic device mounting board 1.

Furthermore, in order to protect the reinforcement portion 4 composed of a metallic layer, the electronic device connection electrode 5, and the wiring conductor 6 left exposed on the surface of the insulating substrate 2 from oxidation, a 0.5 to 10 μm-thick Ni plating layer may be coated on the exposed surfaces of the reinforcement portion 4, the electronic device connection electrode 5, and the wiring conductor 6, or the Ni plating layer and a 0.5 to 3 μm-thick gold (Au) plating layer may be coated successively on the exposed surfaces.

In the thusly constructed electronic device mounting board 1, the electronic device 11 is flip-chip mounted within the recess 2a so as to lie over the opening 3 as seen in a transparent plan view, with its electrodes electrically connected to their respective electronic device connection electrodes 5 formed on the bottom surface of the recess 2a of the insulating substrate 2 by means of solder or a gold bump, and then, as a so-called underfill material, the bonding material 7 made of resin such for example as epoxy resin is injected into a region between the insulating substrate 2 and the electronic device 11 so as to lie along the opening 3, whereupon an electronic apparatus is constructed. Note that the electrical connection between each of the electrodes of the electronic device 11 and each of the electronic device connection electrodes 5 may be established by using a connection member made of electrically-conductive resin (anisotropic conductive resin) instead of the aforementioned solder or gold bump.

For example, the electronic device 11 is a semiconductor device such as a CCD-type electronic device or a CMOS-type image pickup device, or a light-emitting device such as LED.

Figure 3:
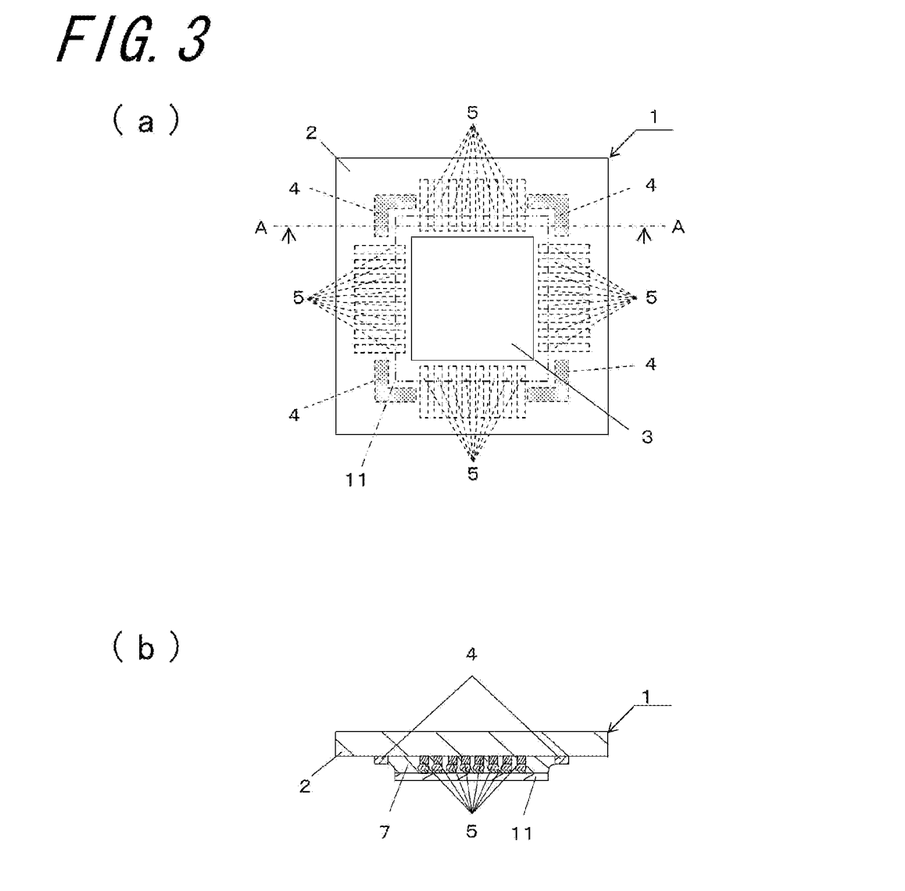
FIG. 3(a) is a transparent plan view showing another modified example of the electronic apparatus in accordance with the first embodiment of the invention.
FIG. 3(b) is a vertical sectional view of the electronic apparatus shown in FIG. 3(a) taken along the line A-A.
Figure 5:
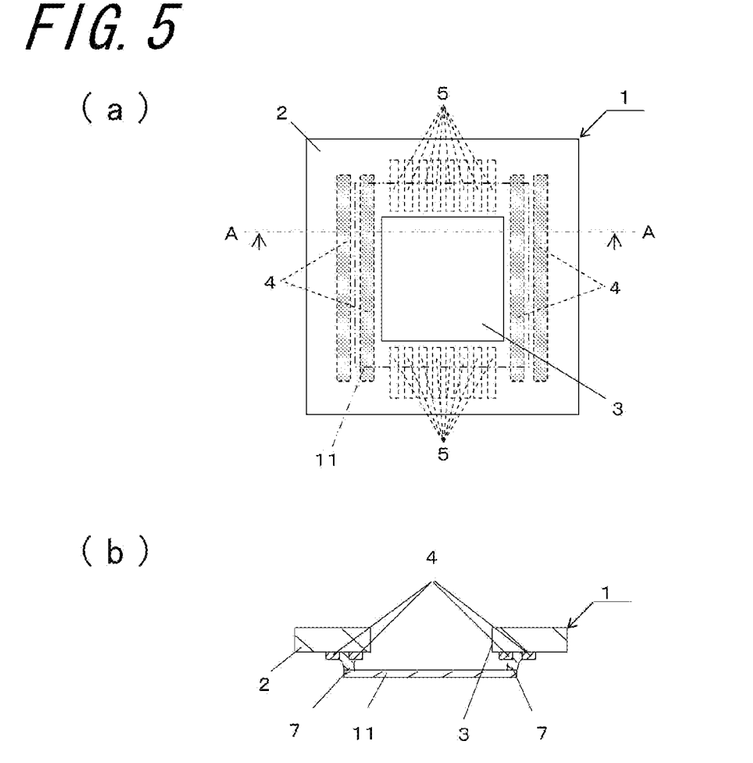
FIG. 5(a) is a transparent plan view showing a modified example of the electronic apparatus in accordance with the second embodiment of the invention.
FIG. 5(b) is a vertical sectional view of the electronic apparatus shown in FIG. 5(a) taken along the line A-A.

As shown in FIGS. 3 and 5, the electronic device mounting board 1 may be shaped like a flat plate. In this case, in the above-described process steps for manufacturing the electronic device mounting board 1, the formation of a part constituting the side wall of the recess 2a is omitted.

Moreover, in FIG. 3, the reinforcement portion 4 is disposed so as to extend along two adjacent sides of the opening 3, and the reinforcement portions 4 arranged along two adjacent sides, respectively, of the opening 3 are connected to each other so as to surround the corner of the opening 3. By disposing the reinforcement portion 4 so as to surround the corner of the opening 3 in this way, it is possible to achieve reinforcement by the reinforcement portion 4 surrounding the corner of the opening 3, and thereby suppress deformation and further suppress that great force is applied to the corner of the opening 3, wherefore occurrence of cracks at the corner of the opening 3 of the insulating substrate 2 can be suppressed effectively.

The electronic device mounting board 1 of the present embodiment comprises: the insulating substrate 2 having the opening 3; and the reinforcement portion 4 disposed on the surface or in the interior of the insulating substrate 2 so as to lie around the opening 3 of the insulating substrate 2 as seen in a transparent plan view. The electronic device 11 is disposed so as to lie over the opening 3 as seen in a transparent plan view. In this construction, for example, even if the thickness of the insulating substrate 2 is reduced, by virtue of the reinforcement portion 4, the electronic device mounting board 1 is resistant to deformation, etc., under a stress applied to the electronic device mounting board 1 when the electronic device 11 is mounted thereon, wherefore occurrence of cracks in the insulating substrate 2 can be prevented effectively.

According to another embodiment of the invention, the electronic apparatus can be made lower in profile by virtue of the installation of the electronic device mounting board 1 having the above-described structure.

Second Embodiment

Figure 4:
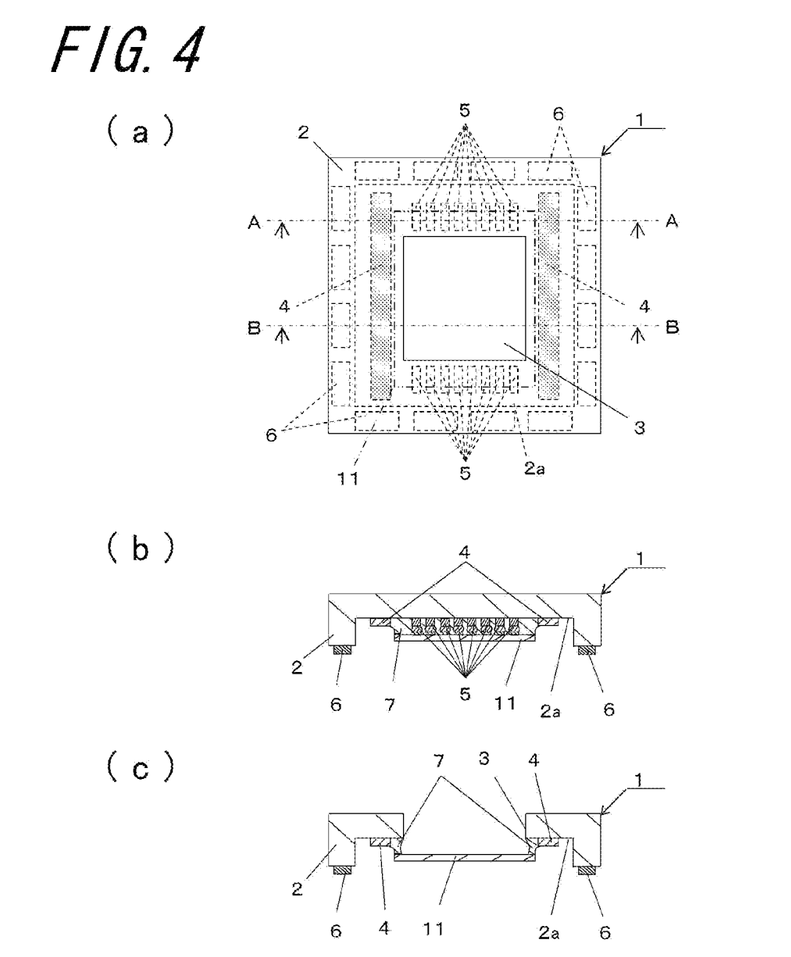
FIG. 4(a) is a transparent plan view showing an electronic apparatus in accordance with a second embodiment of the invention.
FIG. 4(b) is a vertical sectional view of the electronic apparatus shown in FIG. 4(a) taken along the line A-A.
FIG. 4(c) is a vertical sectional view of the electronic apparatus shown in FIG. 4(a) taken along the line B-B.

An electronic apparatus in accordance with a second embodiment of the invention will be described with reference to FIGS. 4 to 7. The electronic apparatus of this embodiment differs from the first embodiment in respect of the shape of the reinforcement portion 4. In FIGS. 4 and 5, the reinforcement portion 4 has a rectangular shape in which one opposed side pair is longer than the other opposed side pair, and it is disposed so as to extend along each of two opposed sides of the opening 3 other than the other two opposed sides thereof situated near the region where the electronic device connection electrode 5 is formed, and, each end of the reinforcement portion 4 is located outwardly of the outer end of the electronic device connection electrode 5. In this case, the reinforcement portion 4, being designed so that its longer side is greater in length than the two opposed sides of the opening 3 different from the two opposed sides thereof situated near the region where the electronic device connection electrode 5 is formed, is capable of strengthening the entire two opposed sides of the opening 3, and is also capable of strengthening the corner of the opening 3 and nearby areas, and the electronic device connection electrode 5 and nearby areas that are subjected to a stress during the installation of the electronic device 11. This makes it possible to achieve reinforcement in a wider range against the stress applied to the opening 3 and nearby areas, and thereby enhance the effect of protecting that part of the insulating substrate 2 located toward the opening 3 from deformation, wherefore occurrence of cracks at the corner of the opening 3 of the insulating substrate 2 can be prevented.

Moreover, it is possible to prevent deformation of the opening 3 caused by a stress developed when the bonding material 7 such as resin used for underfilling is cured during the sealing operation after the installation of the electronic device 11 on the electronic device mounting board 1. Accordingly, it is possible to enhance the effect of preventing occurrence of cracks at the corner of the opening 3 of the insulating substrate 2. In addition, by disposing the reinforcement portion 4 outwardly of the outer side of the electronic device 11, when the electronic device 11 is sealed by means of underfilling using the bonding material 7, it is possible to prevent the bonding material 7 from spreading outward, and thereby adjust the amount of the bonding material 7 required for sealing with ease.

Moreover, in FIG. 5, there are arranged two reinforcement portions 4 in parallel with each other along each of two opposed sides of the opening 3. It is preferable that, of these reinforcement portions 4, the one situated toward the opening 3 has a width greater than or equal to 10% of the distance between the opening 3 and the outer side of the electronic device mounting board 1. Moreover, in the two parallelly-arranged reinforcement portions 4 taken as a pair, when the outer side of the electronic device 11 is located inwardly of the outer reinforcement portion 4, or is located inwardly of the outer reinforcement portion 4 but is located outwardly of the inner reinforcement portion 4 as seen in a transparent plan view, then the bonding material 7 used for underfilling to seal the electronic device 11 and the electronic device mounting board 1 can be flowed into a region between the two reinforcement portions 4, thereby facilitating adjustment to the amount and height of the bonding material 7 and sealing position.

Figure 6:
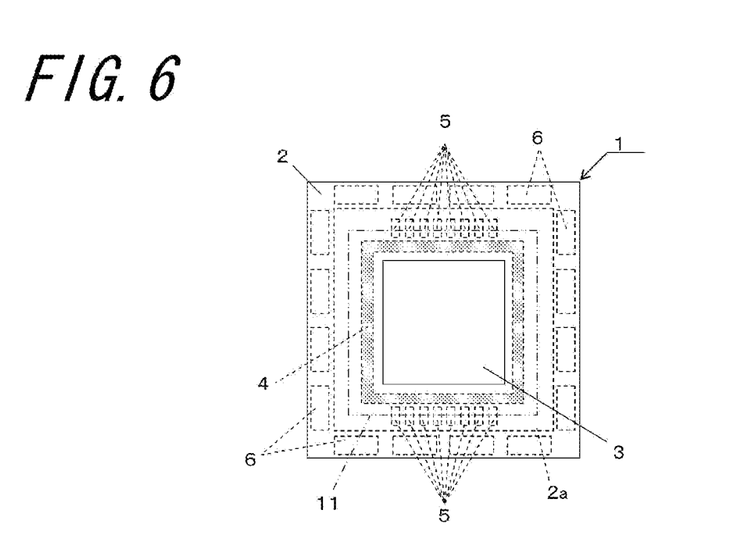
FIG. 6 is a transparent plan view showing another modified example of the electronic apparatus in accordance with the second embodiment of the invention.

Moreover, in FIG. 6, when the construction is seen in a transparent plan view, the reinforcement portion 4 is disposed inwardly of the inner end of the electronic device connection electrode 5, and is located inwardly of the outer side of the electronic device 11 to be mounted so as to have the shape of a frame surrounding the opening 3. By disposing the reinforcement portion 4 inwardly of the inner end of the electronic device connection electrode 5, it is possible to achieve reinforcement in a location nearer to the opening 3 for strengthening the corner of the opening 3 and nearby areas of the insulating substrate 2, and thereby further suppress deformation of the insulating substrate 2, wherefore occurrence of cracks can be prevented effectively. Furthermore, when the reinforcement portion 4 is disposed on one and the same surface as the surface on which the electronic device 11 is mounted, and also the reinforcement portion 4, in its entirety, is located inwardly of the outer side of the electronic device 11 as seen in a transparent plan view, then, after the installation of the electronic device 11, the bonding material 7 is inhibited from spreading inside of the electronic device 11 in the underfilling-based sealing operation.

Figure 7:
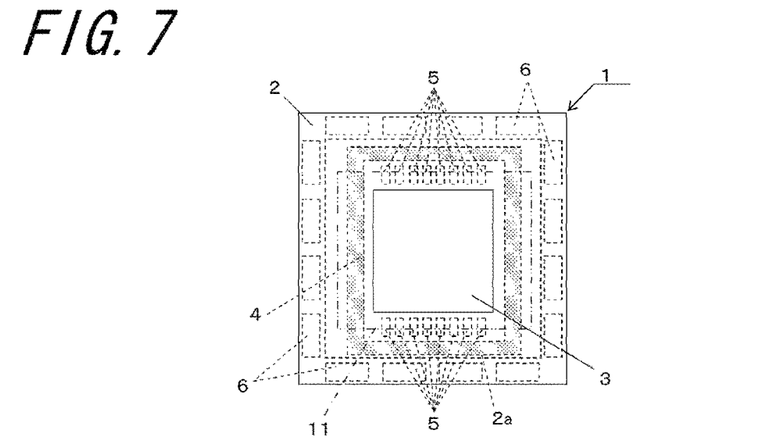
FIG. 7 is a transparent plan view showing another modified example of the electronic apparatus in accordance with the second embodiment of the invention.

Moreover, in FIG. 7, when the construction is seen in a transparent plan view, the reinforcement portion 4 is disposed outwardly of the outer end of the electronic device connection electrode 5, and, that part thereof disposed in parallel with each of two opposed sides of the opening 3 other than the other two opposed sides thereof situated near the region where the electronic device connection electrode 5 is formed is located inwardly of the outer side of the to-be-mounted electronic device 11 so as to have the shape of a frame surrounding the opening 3. In this case, when a region between the electronic device mounting board 1 and the electronic device 11 is sealed with the bonding material 7 such as resin, in the electronic device connection electrode 5 and nearby areas, the bonding material 7 is inhibited from flowing outward, and, on the other hand, in other areas, the bonding material 7 is inhibited from flowing inside of the electronic device 11.

As in the examples shown in FIGS. 8 to 11, in cases where the electronic device connection electrode 5 is disposed on the surface of the insulating substrate 2 so as to lie around the opening 3 of the insulating substrate 2 as seen in a transparent plan view; the insulating substrate 2 includes, at a periphery of the opening 3 as seen in a transparent plan view, an inclined portion 2b inclined toward the side of the electronic device 11; and the reinforcement portion 4 is disposed on the surface of the insulating substrate 2 where the electronic device 11 is disposed, then, for example, even if the opening 3 and nearby areas of the insulating substrate 2 become deformed under a stress applied to the electronic device mounting board 1 when the electronic device 11 is mounted thereon, by virtue of the reinforcement portion 4 situated around the opening 3 of the insulating substrate 2, the opening 3 of the insulating substrate 2 is less prone to contact with the electronic device 11. This makes it possible to prevent damage to the electronic device 11 effectively. The inclined portion 2b is obtained by deforming part of the insulating substrate 2 located around the opening 3 so as to incline toward the electronic device-mounting surface, and, as in the example shown in FIG. 8, a height $H_1$ of the inclined portion 2b in the direction of the thickness of the insulating substrate 2, or equivalently a distance from the flat part of the bottom surface of the recess 2a to the tip of the inclined portion 2b, falls in a range of about 10 μm to 50 μm, and, the reinforcement portion 4 protrudes so that its height $H_2$ is greater than the height $H_1$ of the inclined portion 2b. Moreover, although the inclined portion 2b is defined by an inclined part around the opening 3 as in the examples shown in FIGS. 8 and 9, in a case where the surface of the insulating substrate 2 where the electronic device 11 is disposed is entirely inclined toward the side of the electronic device 11, the inclined portion 2b can be defined by the inclined surface. When the insulating substrate 2 is made of ceramics, the inclined portion 2b is formed by disposing a stacked body of yet-to-be-fired ceramic green sheets for forming the electronic device mounting board 1 on a jig which is equal in shape to the electronic device mounting board 1 as seen in a plan view, is inclined toward the center of the opening 3, and bears a plurality of holes for the passage of a gas such as air, and whereafter sucking the lower side of the jig under a reduced pressure by means of a vacuum pump or the like.

Figure 8:
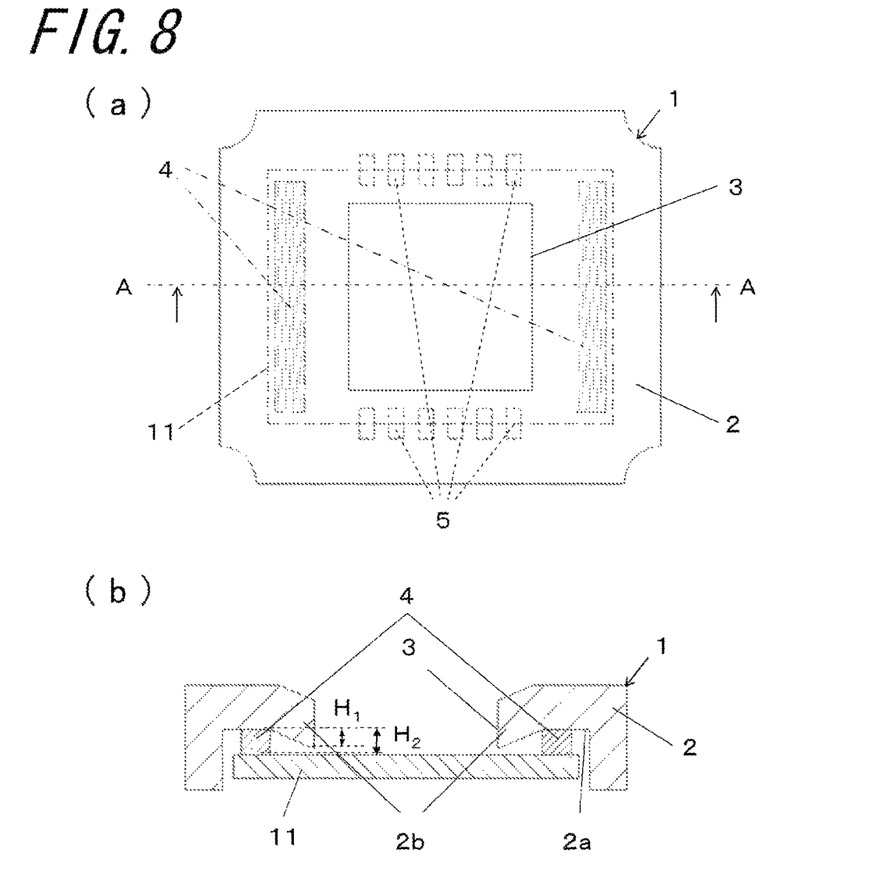
FIG. 8(a) is a transparent plan view showing another modified example of the electronic apparatus in accordance with the embodiment of the invention.
FIG. 8(b) is a vertical sectional view of the electronic apparatus shown in FIG. 8(a) taken along the line A-A.
Figure 9:
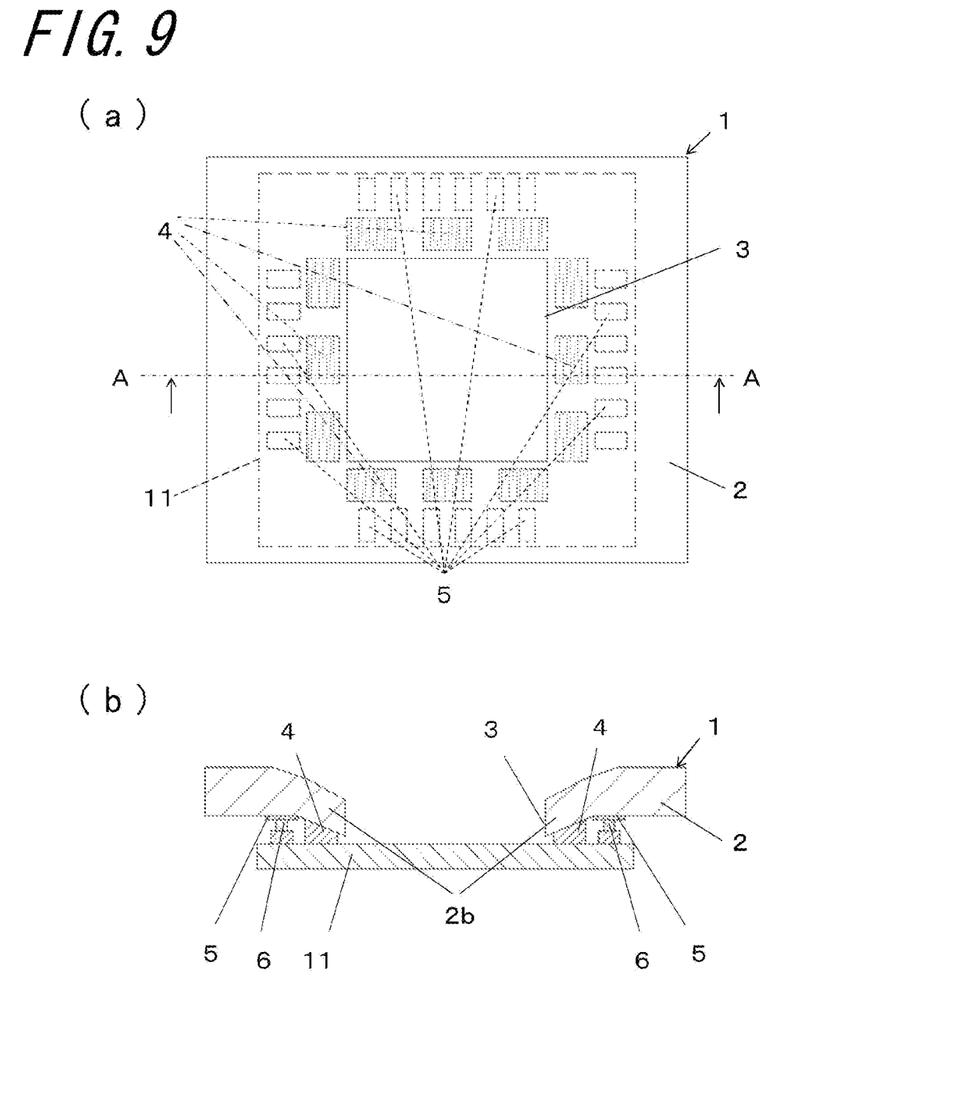
FIG. 9(a) is a transparent plan view showing another modified example of the electronic apparatus in accordance with the embodiment of the invention.
FIG. 9(b) is a vertical sectional view of the electronic apparatus shown in FIG. 9(a) taken along the line A-A.

Moreover, as in the examples shown in FIGS. 8 and 9, it is preferable that two or more reinforcement portions 4 are arranged around the opening 3 as seen in plan view, because, in this case, since two or more reinforcement portions 4 are interposed between the insulating substrate 2 and the electronic device 11, it follows that the opening 3 of the insulating substrate 2 is less prone to contact with the electronic device 11.

Moreover, as in the example shown in FIG. 9, it is preferable that the reinforcement portions 4 are positioned around the opening 3 in island-like arrangement as seen in a plan view, because, in this case, the opening 3 of the insulating substrate 2 is less prone to contact with the electronic device 11, and a stress produced during the installation of the electronic device 11 on the electronic device mounting board 1 can be distributed by the two or more reinforcement portions 4 set in island-like arrangement.

Moreover, as in the examples shown in FIGS. 8 to 11, by arranging the reinforcement portion 4 face to face with the periphery of the opening 3, it is possible to render the opening 3 of the insulating substrate 2 less prone to contact with the electronic device 11, as well as to suppress inclination of the electronic device 11 by the face-to-face arrangement of the reinforcement portion 4. At this time, it is preferable that the reinforcement portion 4 has a uniform height, because, in this case, inclination of the electronic device 11 can be suppressed even further. Furthermore, as in the examples shown in FIGS. 8, 9, and 11, by installing the electronic device 11 in contact with each reinforcement portion 4, for example, when an image pickup device is used as the electronic device 11, it is possible to suppress inclination of the image pickup device even further, and thereby let in external light, or equivalently an image satisfactorily, with the consequence that successful imaging operation can be accomplished. Moreover, when a light-emitting device is used as the electronic device 11, it is possible to allow light to radiate in a predetermined direction satisfactorily.

Figure 10:
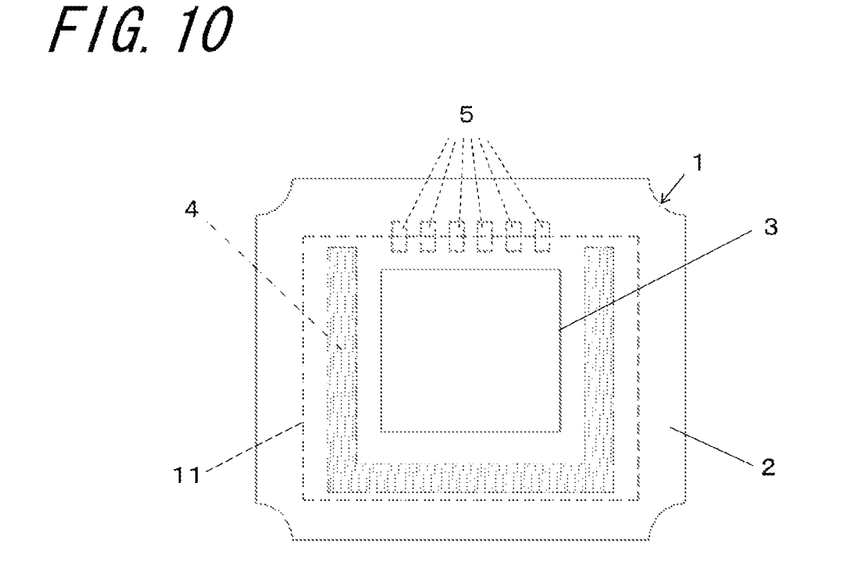
FIG. 10 is a transparent plan view showing another modified example of the electronic apparatus in accordance with the embodiment of the invention.
Figure 11:
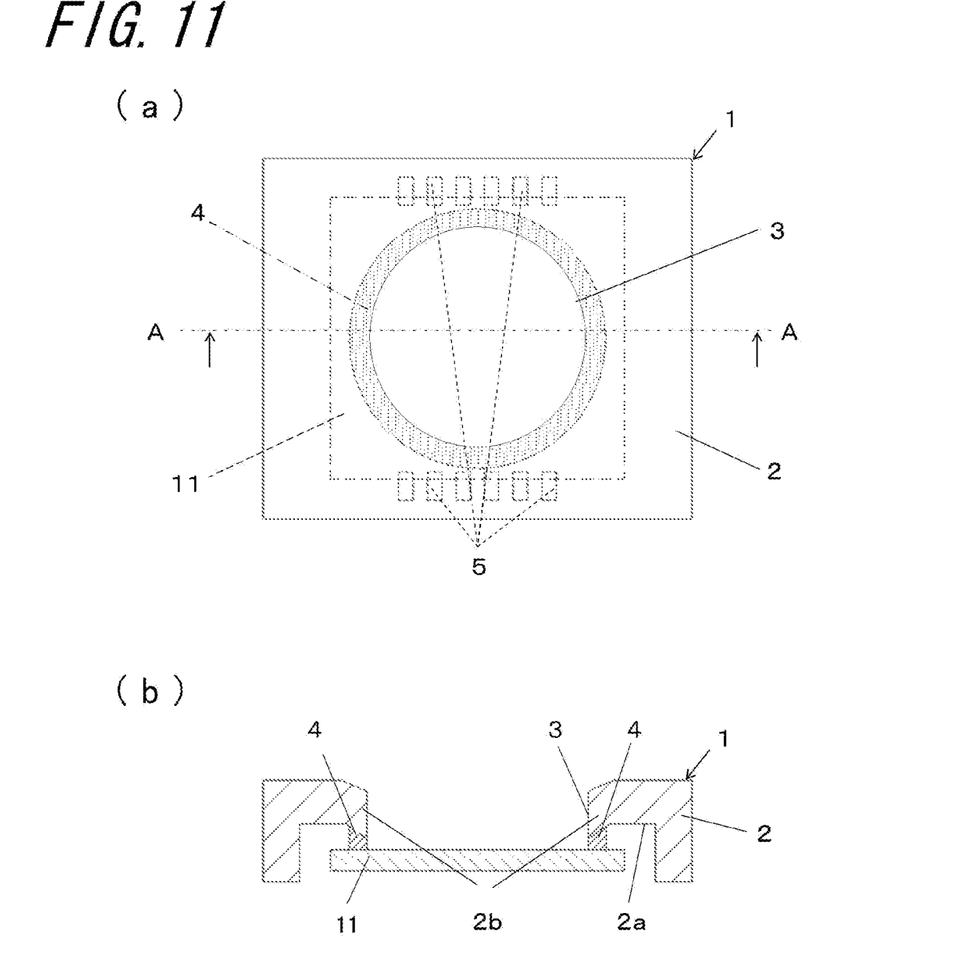
FIG. 11(a) is a transparent plan view showing another modified example of the electronic apparatus in accordance with the embodiment of the invention.
FIG. 11(b) is a vertical sectional view of the electronic apparatus shown in FIG. 11(a) taken along the line A-A.

Moreover, as in the examples shown in FIGS. 8, 10, and 11, in a case where the reinforcement portion 4 is disposed in strip form along the opening as seen in a plan view, since the reinforcement portion 4 formed along the opening 3 is entirely interposed between the insulating substrate 2 and the electronic device 11 when the electronic device 11 is mounted on the electronic device mounting board 1, it is possible to distribute a stress produced during the installation of the electronic device 11 on the electronic device mounting board 1 by the reinforcement portion 4 disposed in a strip form. It is preferable that the length of the reinforcement portion 4 disposed in a strip form is longer than the length of one side of the electronic device 11 opposed thereto, because, in this case, even if misalignment takes place during the installation of the electronic device 11, the reinforcement portion 4 can be properly interposed between the insulating substrate 2 and the electronic device 11.

Moreover, as in the example shown in FIG. 8, it is preferable that the reinforcement portion 4 is located outwardly of the inclined portion 2b formed at the opening 3 as seen in a plan view, because, in this case, the reinforcement portion 4 is, when it is formed on the insulating substrate 2, made to have a uniform height and flatness with ease, and consequently, when the electronic device 11 is brought into contact with the reinforcement portion 4, the electronic device 11 can be hard to be inclined by the reinforcement portion 4.

Moreover, in the examples shown in FIGS. 8 to 11, by providing the reinforcement portion 4, when it is composed of a metallic layer, in a location free from the wiring of the electronic device 11 or a location spaced away from the wiring, electrical short-circuiting of the reinforcement portion 4 with the wiring of the electronic device 11 is suppressed.

Moreover, in the examples shown in FIGS. 8 to 11, it is preferable that a surface of the reinforcement portion 4 that abuts on the electronic device 11 is made flat. As used herein, "flat" means that the abutting surface has the form of a flat surface or a smoothly curved surface free from sharp edges. By designing the abutting surface of the reinforcement portion 4 as a flat surface, when the electronic device 11 is brought into contact with the reinforcement portion 4 when it is mounted on the electronic device mounting board 1, damage of the electronic device 11 caused by contact with the reinforcement portion 4 is suppressed.

Moreover, in the examples shown in FIGS. 8 to 11, the reinforcement portion 4 is greater in thickness, or equivalently in height than the highest part of the inclined portion 2b in the direction of the thickness of the insulating substrate 2. In this case, when the electronic device 11 is mounted on the electronic device mounting board 1, the reinforcement portion 4 is interposed between the insulating substrate 2 and the electronic device 11, wherefore the opening 3 of the insulating substrate 2 is less prone to contact with the electronic device 11 by the reinforcement portion 4. This makes it possible to prevent damage to the electronic device 11 effectively.

In forming such an reinforcement portion 4, an reinforcement portion 4-free electronic device mounting board 1 is produced in advance, and, measurement is made of the height of the inclined portion 2b over the entire perimeter of the opening 3 of the electronic device mounting board 1, so that the reinforcement portion 4 can be made greater in height than the inclined portion 2b. It is preferable that the reinforcement portion 4 is higher than the inclined portion 2b by about 5 μm.

When the inclined portion 2b is formed around the opening 3 as described above, for example, the inclined portion 2b can be formed by disposing a stacked body of yet-to-be-fired ceramic green sheets for forming the electronic device mounting board 1 on a jig which is equal in shape to the electronic device mounting board 1 as seen in a plan view, is inclined toward the center of the opening 3, and bears a plurality of holes for the passage of a gas such as air, and whereafter sucking the lower side of the jig under a reduced pressure by means of a vacuum pump or the like.

It should be noted that the invention is not limited to the embodiments described hereinabove, and therefore various changes and modifications are possible. For example, there is no restriction on the arrangement, number, and shape of the electronic device connection electrode 5 and the wiring conductor 6.

REFERENCE SIGNS LIST

1: Electronic device mounting board
2: Insulating substrate
2a: Recess
2b: Inclined portion
3: Opening
4: Reinforcement portion
5: Electronic device connection electrode
11: Electronic device

The invention claimed is:

1. An electronic device mounting board, comprising:
   an insulating substrate consisting essentially of ceramics and having an opening, on the insulating substrate an electronic device being disposed lying over the opening as seen in a transparent plan view;
   a reinforcement portion consisting essentially of ceramics, wherein the reinforcement portion is disposed on a surface or in an interior of the insulating substrate so as to lie around the opening of the insulating substrate as seen in a transparent plan view, the reinforcement portion being connected with the insulating substrate; and
   an electronic device connection electrode disposed on a surface of the insulating substrate so as to lie around the opening of the insulating substrate as seen in a transparent plan view,
   wherein the insulating substrate includes, at a periphery of the opening as seen in a transparent plan view, an inclined portion inclined toward a side of the electronic device, and
   the reinforcement portion is disposed on a surface of the insulating substrate where the electronic device is disposed.

2. The electronic device mounting board according to claim 1,
   wherein the reinforcement portion is disposed along the opening as seen in a transparent plan view.

3. The electronic device mounting board according to claim 1,
   wherein the opening has a polygonal shape and the reinforcement portion is disposed so as to extend along one side of the polygonal shape, as seen in a transparent plan view.

4. The electronic device mounting board according to claim 1,
   wherein the opening has a polygonal shape and the reinforcement portion is disposed so as to extend along two adjacent sides of the polygonal shape, as seen in a transparent plan view.

5. An electronic apparatus, comprising: the electronic device mounting board according to claim 1; and an electronic device disposed so as to lie over the opening formed in the electronic device mounting board as seen in a transparent plan view.

6. The electronic device mounting board according to claim 1, wherein a metallic layer is disposed between the insulating substrate and the reinforcement portion.

7. An electronic device mounting board, comprising:
- an insulating substrate consisting essentially of ceramics and provided with a through hole, on the insulating substrate an electronic device covering an opening as seen in a transparent plan view;
- a reinforcement portion consisting essentially of ceramics, wherein the reinforcement portion is disposed on a surface or in an interior of the insulating substrate so as to lie around the opening of the through hole as seen in a transparent plan view, the reinforcement portion being connected with the insulating substrate; and
- an electronic device connection electrode disposed on a surface of the insulating substrate so as to lie around the opening of the insulating substrate as seen in a transparent plan view,
- wherein the insulating substrate includes, at a periphery of the opening as seen in a transparent plan view, an inclined portion inclined toward a side of the electronic device, and
- the reinforcement portion is disposed on a surface of the insulating substrate where the electronic device is disposed.

8. An electronic apparatus, comprising: the electronic device mounting board according to claim 7; and the electronic device disposed so as to cover the opening of the through hole formed in the electronic device mounting board as seen in a transparent plan view.

* * * * *